(12) United States Patent
Aitken et al.

(10) Patent No.: US 6,252,275 B1
(45) Date of Patent: *Jun. 26, 2001

(54) SILICON-ON-INSULATOR NON-VOLATILE RANDOM ACCESS MEMORY DEVICE

(75) Inventors: John M. Aitken, South Burlington; Steven W. Mittl; Alvin W. Strong, both of Essex Junction, all of VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/226,677

(22) Filed: Jan. 7, 1999

(51) Int. Cl.[7] .......................... H01L 29/788; H01L 29/76

(52) U.S. Cl. .......................... 257/318; 257/214; 257/315; 257/316; 257/321; 257/322

(58) Field of Search .................................. 257/214, 315, 257/316, 318, 321, 322

(56) References Cited

U.S. PATENT DOCUMENTS

| | | | |
|---|---|---|---|
| 4,203,158 | 5/1980 | Frohman-Bentchkowksy et al. | 365/185 |
| 4,253,106 | 2/1981 | Goldsmith et al. | 357/23 |
| 4,279,069 | 7/1981 | Beguwala et al. | 29/571 |
| 4,297,719 | 10/1981 | Hsu | 357/23 |
| 4,332,077 | 6/1982 | Hsu | 29/571 |
| 4,404,577 | 9/1983 | Cranford, Jr. et al. | 357/23 |
| 4,453,234 | 6/1984 | Uchida | 365/185 |
| 4,586,240 | 5/1986 | Blackstone et al. | 29/571 |
| 4,619,034 | 10/1986 | Janning | 29/571 |
| 4,656,607 | 4/1987 | Hagiwara et al. | 365/182 |
| 4,692,994 | 9/1987 | Moniwa et al. | 437/40 |
| 4,755,482 | 7/1988 | Nagakubo | 437/84 |
| 4,829,016 | 5/1989 | Neudeck | 437/31 |
| 4,907,053 | * 3/1990 | Ohmi . | |
| 4,999,691 | 3/1991 | Hsu et al. | 357/23.7 |
| 5,023,200 | 6/1991 | Blewer et al. | 437/187 |
| 5,084,905 | 1/1992 | Sasaki et al. | 357/71 |
| 5,122,476 | 6/1992 | Fazan et al. | 437/52 |
| 5,134,454 | 7/1992 | Neudeck et al. | 357/34 |
| 5,146,304 | 9/1992 | Yue et al. | 357/34 |
| 5,191,397 | 3/1993 | Yoshida | 257/347 |
| 5,272,095 | 12/1993 | Enquist et al. | 437/31 |
| 5,273,921 | 12/1993 | Neudeck et al. | 437/41 |
| 5,308,445 | 5/1994 | Takasu | 117/90 |
| 5,347,154 | 9/1994 | Takahashi et al. | 257/347 |
| 5,382,832 | 1/1995 | Buti et al. | 257/773 |
| 5,387,555 | 2/1995 | Linn et al. | 437/225 |
| 5,391,895 | 2/1995 | Dreifus | 257/77 |
| 5,411,905 | 5/1995 | Acovic et al. | 437/43 |
| 5,422,299 | 6/1995 | Neudeck et al. | 437/63 |
| 5,446,299 | 8/1995 | Acovic et al. | 257/316 |
| 5,455,791 | 10/1995 | Zaleski et al. | 365/185.26 |
| 5,488,243 | * 1/1996 | Tsuruta et al. | 257/314 |
| 5,569,620 | 10/1996 | Linn et al. | 437/62 |
| 5,569,621 | 10/1996 | Yallup et al. | 437/62 |
| 5,583,068 | 12/1996 | Jones, Jr. et al. | 437/52 |
| 5,585,284 | 12/1996 | Park | 437/21 |
| 5,597,739 | 1/1997 | Sumi et al. | 437/21 |
| 5,610,083 | 3/1997 | Chan et al. | 437/21 |
| 5,621,239 | 4/1997 | Horie et al. | 257/499 |
| 5,801,414 | * 9/1998 | Shinmari | 257/315 |
| 5,841,693 | * 11/1998 | Tsukiji | 365/185.01 |
| 5,929,479 | * 7/1999 | Oyama | 257/315 |

* cited by examiner

Primary Examiner—Ngân V. Ngô
(74) Attorney, Agent, or Firm—Ratner & Prestia; Tiffany L. Townsend, Esq.

(57) ABSTRACT

A non-volatile random access memory (NVRAM) structure comprising an injector element in a single crystal silicon substrate; an insulator layer over the substrate; a silicon-on-insulator (SOI) layer over the insulator layer; and a sensing element in the SOI layer overlying the injector element. The NVRAM structure may further comprise a gate above the SOI layer, a floating gate in the insulator layer, or both.

25 Claims, 4 Drawing Sheets

SILICON-ON-INSULATOR NON-VOLATILE RANDOM ACCESS MEMORY DEVICE

TECHNICAL FIELD

The present invention relates generally to nonvolatile memory devices and, more specifically, to integrated circuits used for Non-Volatile Random Access Memory (NVRAM) devices.

BACKGROUND OF THE INVENTION

Non-volatile memory devices are electrically programmable and erasable to store charge in a location within the device and to retain that charge when power to the device is shut off. An array of non-volatile devices that allows individual locations to be read with random access is called a Non-Volatile Random Access Memory (NVRAM).

The key to operation of the NVRAM is an individual semiconductor device whose conduction state can be altered by the presence or absence of charge in an insulating layer, or in a conductive layer imbedded in an insulating layer, in close proximity to the conduction channel of a MOSFET (Metal-Oxide-Silicon Field Effect Transistor). The non-volatile character of the storage depends on the ability of the device to retain that charge for long periods of time even when power is not applied to the device. One device type stores charge in the insulating layer of the MOSFET, typically at the interface of a nitride-oxide dual layer deposited on a silicon substrate forming the channel of a MOSFET. This device is commonly called an MNOS (Metal-Nitride-Oxide-Silicon) device.

Another embodiment of an NVRAM device uses the charge stored in a polysilicon layer that is electrically isolated from the conduction channel in the silicon by a thin layer of insulating material, typically silicon dioxide. This device, described in U.S. Pat. No. 4,203,158 issued to Froman-Bentchkowsy et al. and assigned to the Intel Corporation of Santa Clara, California, is known as a Floating Anode MOS (FAMOS) or Insulated Gate Field Effect Transistor (IGFET).

Both the IGFET and the MNOS work by injecting or tunneling charge generated in the silicon substrate or diffusions by application of high voltages to the silicon terminals. The high electrical field across the device injects or tunnels charge into or across the insulating layer into a storage region. In the MNOS device, the silicon nitride-silicon oxide interface stores the charge. In the IGFET, the floating polysilicon gate stores the charge.

The ability of the devices to change their state through a large number of read-write-erase cycles is an important consideration in the use of NVRAM devices. That ability is called "cyclability." NVRAM devices must be able to cycle in excess of a million times without any degradation in performance or difficulty in discrimination between a "1"or a "0". In practice, cyclability depends on the device type and the process steps used in the device fabrication. Eventually, however, the erase-write operations that change the device charge state may degrade the cyclability of individual devices.

Referring now to FIG. 1, there is shown an IGFET device 19 of the prior art. For writing and erasing in IGFET device 19, diffusion regions 11 and 11' or control gate 12 inject carriers into the polysilicon floating gate 14. The diffusion regions 11 and 11' typically do the writing and the control gate 12 does the erasing. An oxide layer 16 (which may comprise a number of oxide layers, depending on the fabrication technique) separates the floating gate 14 from the control gate 12 and the single crystal silicon substrate 10.

After the charge has been written or erased, the diffusion regions 11, 11' may function as a sensing element. By applying a first voltage to one diffusion region 11 and measuring the ability of the current to flow to the other diffusion region 11' biased at a second, lower voltage, the charge state of the floating gate 14 may be determined.

NVRAM devices commonly use two methods of charge injection and removal. In the first method, hot carriers are injected by a source of hot carriers generated in the channel 17 between the diffusion regions 11 and 11' or from biasing the diffusion regions 11 and 11' to be close to or in avalanche breakdown. In the other method of injecting charge, Fowler-Nordheim (FN) tunneling transports charge from the silicon substrate 10. Achievement of avalanche breakdown or hot electron injection requires a single crystal silicon layer. Generally, injection by avalanche breakdown or hot carrier injection uses a lower voltage than FN tunneling, so the first method is preferred.

Referring now to FIG. 2, there is shown an IGFET device 19' that uses FN tunneling. Floating gate 14' of device 19' has an injector tab 15 over diffusion region 11. The injector tab 15 reduces the oxide thickness between diffusion region 11 and floating gate 14, thus reducing the voltage required for FN tunneling.

When the single crystal silicon substrate 10 is the source or sink for the injected carriers by either avalanche injection or FN tunneling, the silicon interface that forms the active electrical channel 17 for the FET is subjected to high fields. The high fields may lead to the formation of interface states and trapped charge in the oxide. Thus, during each write cycle, some fraction of the generated charge may become permanently trapped in the gate oxide and will not erase. As this unwanted charge accumulates in the oxide, the threshold voltage of a cycled device gradually approaches a value that cannot distinguish between a device in a "1" state or a "0" state, and the device ceases to operate correctly. This excess of accumulated charge is not reversible, and thus the cyclability window—the number of times the device can be written and erased—is reduced.

The high electric fields required to inject carriers into the floating gate also pose problems because the injecting diffusion regions 11, 11' are also the source and drain of the FET that is the sensing element of the device. The high fields necessary for injection degrade the ability of the device to sense the state of the floating gate 14 as it is cycled many times.

A number of solutions have been implemented in NVRAM circuits to address these problems. One solution uses higher voltages to compensate for the trapped charge that gives a false reading for gate charge. Another solution physically removes the injection point away from the sensing element so that the impact of the charge generated in the write-erase cycle has no effect on the channel of the sensing element. Many of these solutions take up too much space, and are thus not widely practiced in the industry.

Therefore, there is still a need in the industry for an NVRAM device that lowers the voltages at which charge can be written and erased, and that improves the cyclability of the device.

SUMMARY OF THE INVENTION

To meet this and other needs, and in view of its purposes, the present invention provides an NVRAM structure comprising an injector element in a single crystal silicon substrate; an insulator layer over the substrate; a silicon-on-insulator (SOI) layer over the insulator layer; and a sensing element in the SOI layer overlying the injector element. The NVRAM structure may further comprise a gate above the SOI layer, a floating gate in the insulator layer, or both. It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DESCRIPTION OF INVENTION

Figure 1:
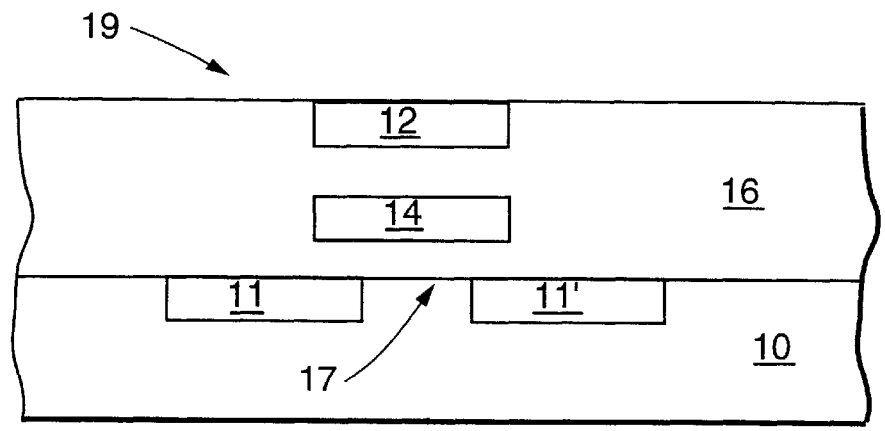
FIG. 1 shows a cross-sectional view illustrating an IGFET device of the prior art.
Figure 2:
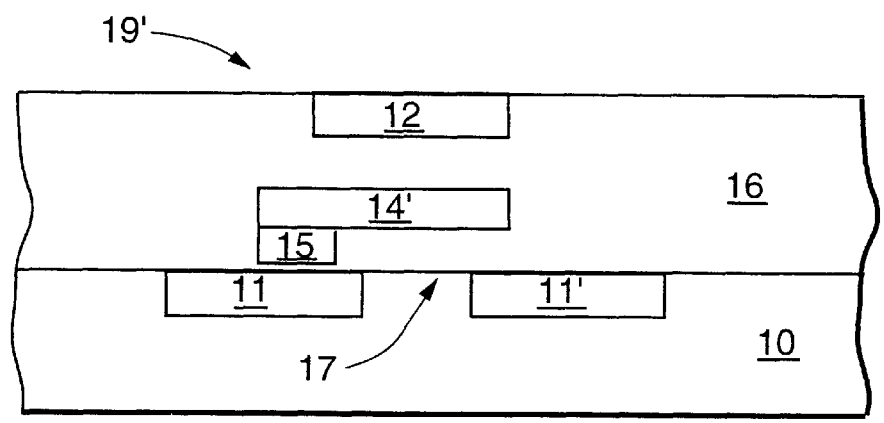
FIG. 2 shows a cross-sectional view illustrating an alternate embodiment of an IGFET device of the prior art.
Figure 3:
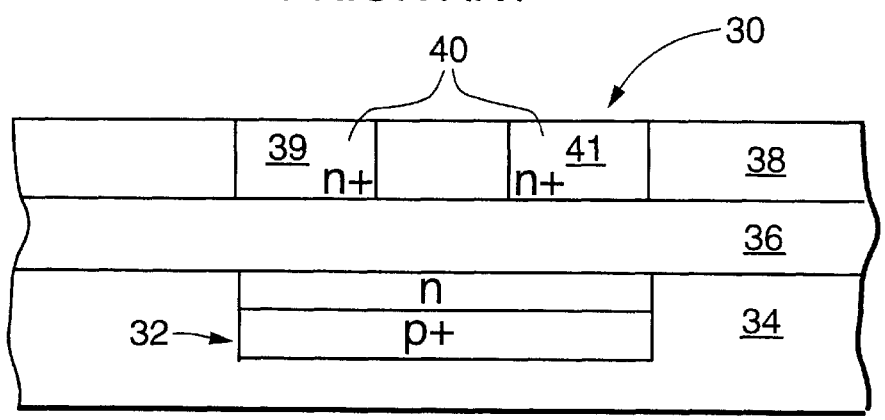
FIG. 3 shows a cross-sectional view illustrating an exemplary embodiment of an NVRAM device of the present invention.

Referring now to the drawing, in which like reference numerals refer to like elements throughout, FIG. 3 is a cross-sectional view illustrating a basic embodiment of an NVRAM device 30 according to the present invention. NVRAM device 30 comprises an injector element 32 in the form of a diode in a single crystal silicon substrate 34; an insulator layer 36, such as silicon dioxide, over the substrate 34; a silicon-on-insulator (SOI) layer 38 over the insulator layer 36; and a sensing element 40 in the SOI layer 38 overlying the injector element 32.

The most basic injector element 32 may simply be an epitaxial layer, and may be either p+ doped, as shown in FIG. 3, or n+ doped, depending on the preferred operation of the structure. The sensing element 40 comprises diffusion regions 39 and 41 that are preferentially doped oppositely (n+ as shown in FIG. 3) from the injector element 32 (p+ in FIG. 3). To turn the sensing element 40 on or off, the diode or injector element 32 injects charge (holes or electrons, depending on the doping) into the insulator layer 36, where the charge is trapped. Sensing element 40 removes the trapped charge, either by injection of the opposite charge or by FN tunneling.

Figure 4:
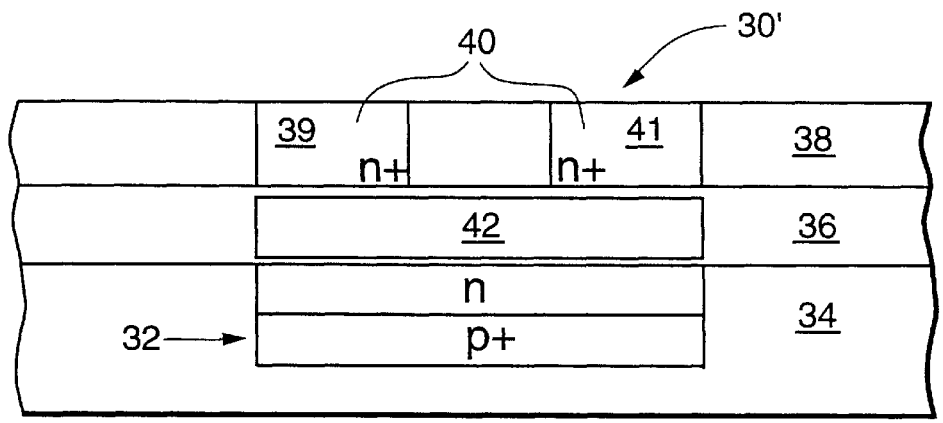
FIG. 4 shows a cross-sectional view illustrating an exemplary embodiment of an NVRAM device of the present invention, having a floating gate structure between the injector element and the sensing element.

Referring now to FIG. 4, there is shown a cross sectional view illustrating an alternate embodiment of an NVRAM device. NVRAM device 30' as shown in FIG. 4 is similar to the NVRAM device 30 shown in FIG. 3, but with a floating gate 42 in the insulator layer 36. This embodiment can be built with conventional SIMOX technology by tailoring the oxygen implant dosages to leave a region of silicon between two oxide layers (the portions of insulator layer 36 above and below floating gate 42), with conventional BESOI technology, or with ELO or similar technology. Both SIMOX and BESOI are well known in the art. ELO is described below.

By placing the hot carrier injection site (injector element 32) in a different layer than the charge sensing element 40, the sensing element 40 is not subjected to the high voltages associated with injection. Therefore, the sensing element 40 avoids the trapped charges associated with prior NVRAM structures as described in the background section above. NVRAM device 30 can be built with conventional Separation by Implanted Oxygen (SIMOX) or by Bond and Etch-Back Silicon-On-Insulator (BESOI) technology.

The preferred process for manufacture uses Edge-Defined Lateral Overgrowth (ELO) of epitaxial silicon subsequently planarized by Chemical Mechanical Polishing (CMP), as described below. The combined ELO and CMP process has the advantage that a refractory metal, such as tungsten, can be imbedded in insulator layer 36 to make floating gate 42. In the alternative, single crystal silicon from substrate 34 may be grown to form floating gate 42. Thus, floating gate 42 may be polysilicon, single crystal silicon, or a refractory metal such as tungsten.

As shown in FIG. 4, the floating gate 42 acts as a gate for the sensing element 40. Sensing element 40 can sense the charge on the floating gate 42 by measuring the current flowing between the two diffusion regions 39 and 41 in the SOI layer 38. Again, the choice of diffusion dopings is arbitrary, but it is advantageous to choose dopings so that opposite carriers can be injected or tunneled from substrate 34 and SOI layer 38 into the floating gate 42. As with the other embodiments of the present invention, charge may be written into or erased from floating gate 42 by injecting or tunneling from substrate 34 or SOI layer 38.

Figure 5:
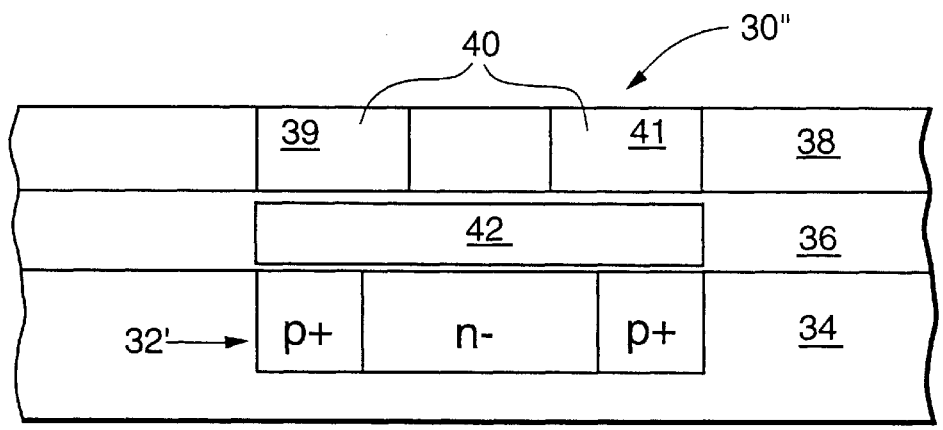
FIG. 5 shows a cross-sectional view illustrating an exemplary embodiment of an NVRAM device of the present invention, having a pFET injector element and an nFET sensing element.

Referring now to FIG. 5, there is shown yet another schematic illustration of a cross section of an embodiment of an NVRAM device. NVRAM device 30" shown in FIG. 5 is similar to NVRAM device 30' shown in FIG. 4, except that the injector element 32' is a pFET. The sensing element 40 is essentially an nFET created by the presence of the floating gate 42 adjacent to the diffusion regions 39 and 41. Similarly, the sensing element 40 could be a pFET and the injector element an nFET. Both elements could be pFETs or both nFETs, as well, but as earlier detailed, it is more advantageous for the elements to be oppositely charged so that opposite carriers can be injected from each element.

NVRAM device 30" can be manufactured using the standard SIMOX process and implanting the PFET (or nFET) diffusions from isolation trenches between adjacent NVRAM devices (trenches discussed below). A boron implant may be used to form the diffusions for a PFET. NVRAM device 30" can also be fabricated by a combined ELO and CMP process as described below. An alternate embodiment may lack floating gate 42, producing an NVRAM device that is essentially equivalent to the NVRAM device 30 shown in FIG. 3, in which the injector element 32, 32' is a pFET or an nFET.

Figure 6:
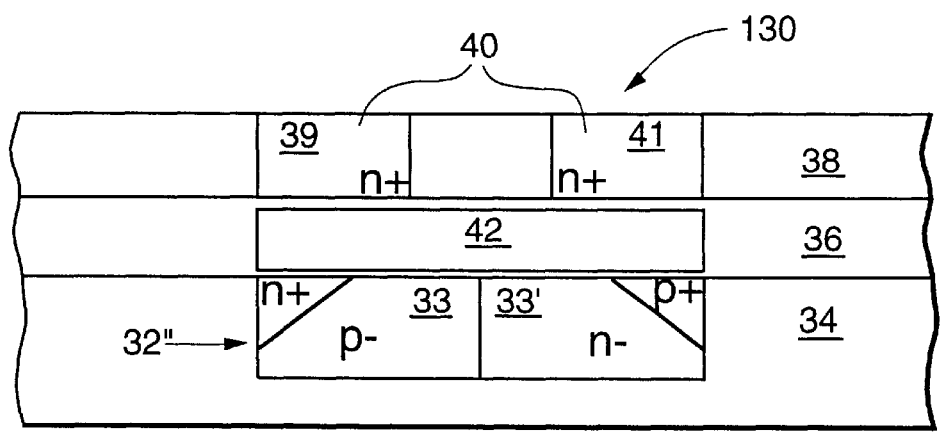
FIG. 6 shows a cross-sectional view illustrating an exemplary embodiment of an NVRAM device of the present invention, having a complementary diode injector.

Referring now to FIG. 6, there is shown a cross-sectional view illustrating yet another embodiment of the present invention. NVRAM device 130 is similar to NVRAM device 30", except that the injector element 32" comprises complementary diodes 33 and 33'. A structure having independent injectors of two different carrier types allows the injection element 32" to inject both holes and electrons into the floating gate 42. This configuration gives the maximum benefit in lowering the voltages needed to write-erase the device and in removing the injection site away from the sense site, because the sensing element 40 does not participate in the writing or erasing process. Injector element 32" having complementary diodes 33 and 33' may also be used with an NVRAM device 30 of FIG. 3, replacing injector element 32. NVRAM device 130 can be fabricated with conventional BESOI processing in which blanket films of SOI and polysilicon or single crystal silicon can be bonded to a silicon substrate covered with an insulator such as silicon oxide, or by ELO as described below.

Figure 7:
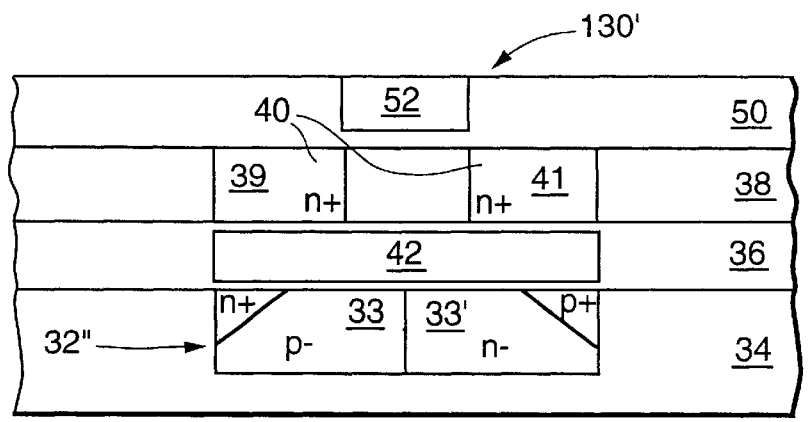
FIG. 7 shows a cross-sectional view illustrating an exemplary embodiment of an NVRAM device of the present invention, having a complementary diode injector and a gate above the SOI layer.

Referring now to FIG. 7, there is shown a cross sectional view illustrating another embodiment of the present invention. NVRAM device 130' is similar to NVRAM device 130 except for polysilicon topside gate 52 in oxide layer 50 located above the sensing element 40. The charge in topside gate 52 is capacitively coupled to the SOI layer 38, and changes its threshold voltage through the body effect. The measure of the charge state of floating gate 42 is thus the amount of current flowing between diffusion regions 39 and 41, instead of the measure being whether the current is flowing or not flowing, as is the case when no topside gate 52 is present. A polysilicon topside gate 52 may be used in conjunction with any of the previously described NVRAM device embodiments 30, 30', 30", and 130 of the present invention.

Figure 8:
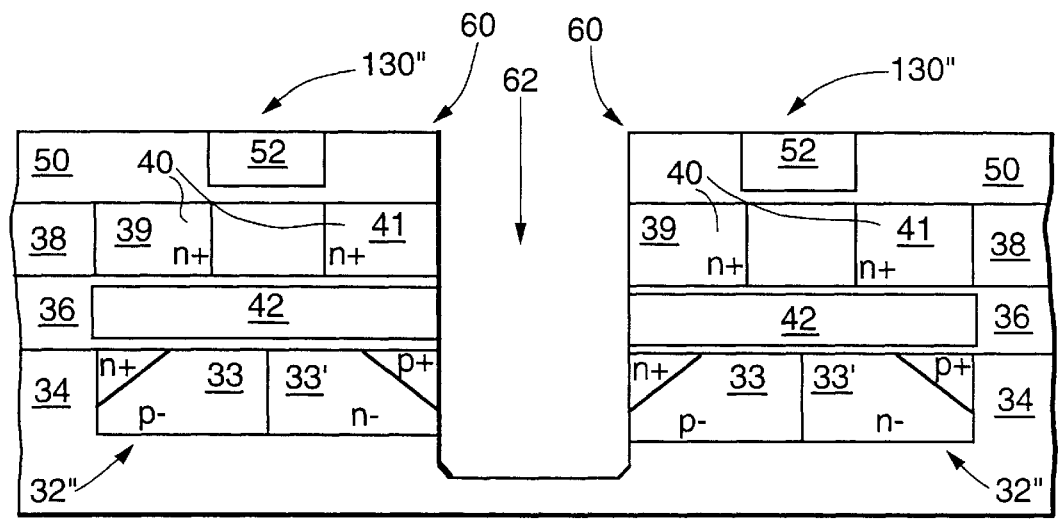
FIG. 8 shows a cross-sectional view illustrating an exemplary embodiment of a pair of NVRAM devices of the present invention comprising mesas having a trench between the mesas.

Referring now to FIG. 8, there is shown a cross sectional view illustrating another feature of the present invention. Individual stacks of any of the NVRAM embodiments 30, 30', 30", 130, and 130' previously described, and NVRAM device 130" shown in FIG. 8, can be isolated onto mesas 60 having trenches 62 between mesas 60. These trenches 62 may be etched and then filled with an insulator, such as silicon dioxide, to passivate the individual mesa structures. This process allows the NVRAM component layers to be manufactured across a large section of substrate and the trench 62 etched to form the individual NVRAM devices 130". NVRAM device 130" is essentially the same as NVRAM device 130'.

Figure 9A:
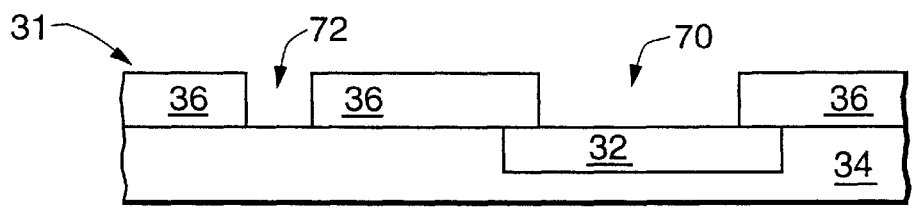
FIGS. 9a, 9b, 9c, 9d, and 9e illustrate exemplary process steps used to manufacture one embodiment of the present invention by Edge-Defined Lateral Overgrowth (ELO) with subsequent planarization by chemical mechanical polishing (CMP).

The various NVRAM device structures described above may be preferentially manufactured by a combined ELO and CVD process. Referring now to FIGS. 9a, 9b, 9c, and 9d, this process will be described step-by-step. The process of manufacturing an NVRAM structure such as the NVRAM device 30' (shown in FIG. 3) by ELO and CVD starts with a wafer 31 comprising a single crystal silicon substrate 34 as shown in FIG. 9a. The process comprises first forming an injector element 32 in the substrate 34. This injector element 32 may be epitaxial silicon or it may be a diode. The injector element 32 may be an nFET, a pFET, or a complementary diode. Injector element 32 may be created by ion-implantation or any method known in the art.

The process next comprises creating silicon dioxide insulator layer 36 over substrate 34, and making a contact cut 70 in the silicon dioxide insulator layer 36 over the injector element 32 and a seed cut 72 adjacent to the contact cut 70 as shown in FIG. 9a. Cuts 70 and 72 may be etched by RIE or by another method known in the art.

Figure 9B:
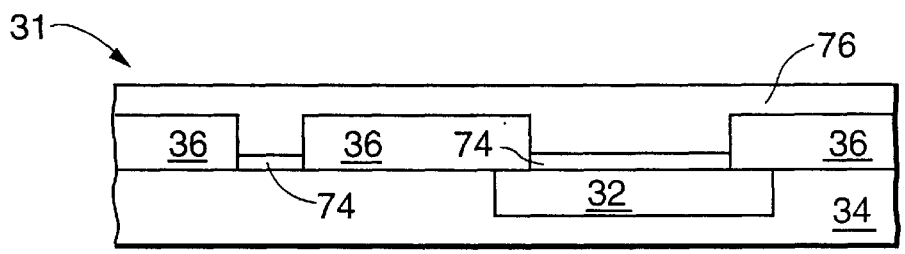

Next, as shown in FIG. 9b, a first thin oxide layer 74 (silicon dioxide) is grown from the silicon substrate 34 over the injector element 32 in the contact cut 70 and in seed cut 72. Then, a floating gate layer 76 is created over the silicon dioxide insulator layer 36 and over the first thin oxide layer 74. The floating gate layer 76 may be single crystal silicon, polysilicon, or a refractory metal. A floating gate layer 76 of single crystal silicon may be grown by etching seed cut 72 to the silicon substrate 34 and growing silicon over the entire wafer 31 by ELO. Portions of the floating gate layer 76 over the silicon dioxide insulator layer 36 are removed by CMP, leaving the floating gate layer 76 in only the cuts 70 and 72. A second thin oxide layer 78 (silicon dioxide) is applied over wafer 31.

Figure 9C:
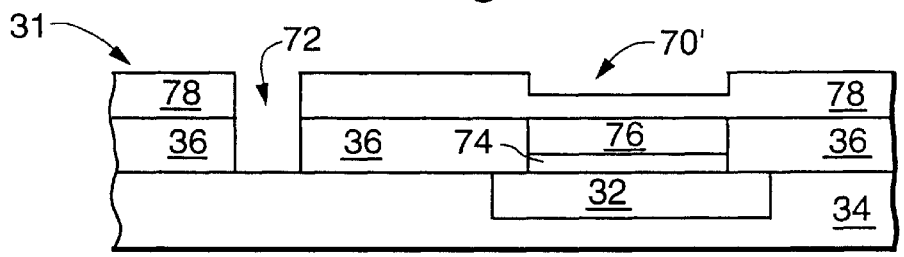

Next, the seed cut 72 is opened to provide access to the silicon substrate 34 again. At the same time, a depression 70' in the location of contact cut 70 is opened in the second thin oxide layer 78 over the floating gate layer 76, leaving a thickness of the second thin oxide layer 78 between the floating gate layer 76 and the depression 70', as shown in FIG. 9c. In the alternative, the seed cut 72 may be opened for the first time at this stage, rather than being created at the same time as the contact cut 70.

Figure 9D:
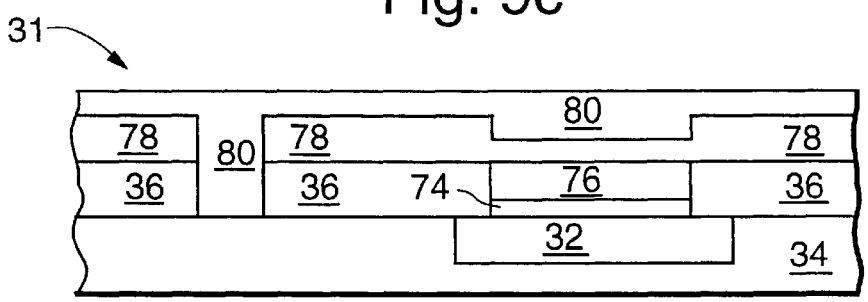
Figure 9E:
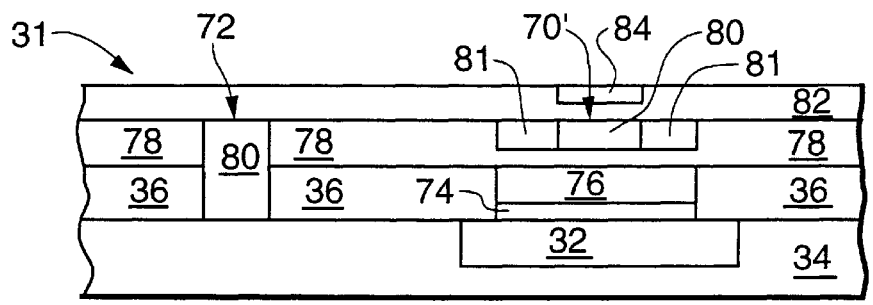

Next, a doped epitaxial silicon film 80 (SOI) is grown over the second thin oxide layer 78 by edge-defined lateral overgrowth, as shown in FIG. 9d. Excess silicon over second thin oxide layer 78 is removed by CMP, leaving the silicon film 80 only in the contact cut depression 70' and seed cut 72 as shown in FIG. 9e. Diffusion regions 81 are created in the epitaxial silicon film 80, preferably by ion implantation.

An NVRAM device may be desired that incorporates a sensing mechanism including a silicon topside gate. If so, then the process further comprises applying a silicon oxide layer 82 over the silicon film 80 and over the second thin oxide layer 78. A polysilicon gate 84 is then defined over the injector by any method known in the art.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A Non-Volatile Random Access Memory (NVRAM) device comprising:
   a single crystal silicon substrate;
   an injector element disposed in the substrate, said injector element comprising a p-n junction;
   an insulator layer over the substrate;
   a silicon-on-insulator (SOI) layer over the insulator layer; and
   a sensing element in the SOI layer overlying the injector element.

2. The NVRAM device according to claim 1, wherein the insulator layer comprises silicon dioxide.

3. The NVRAM device according to claim 1, wherein the sensing element comprises a first and a second diffusion region spaced apart in the SOI layer.

4. The NVRAM device according to claim 1, wherein the injector element is an epitaxial layer.

5. The NVRAM device according to claim 4, further comprising an isolated floating gate embedded in the insulator layer.

6. The NVRAM device according to claim 5, wherein the isolated floating gate comprises a material selected from the group consisting of polysilicon, single crystal silicon, and refractory metal.

7. The NVRAM device according to claim 5, wherein the sensing element further comprises a gate above the SOI layer.

8. The NVRAM device according to claim 7, wherein the NVRAM structure is one of a plurality of NVRAM structures, each structure comprising a mesa, and each mesa having a trench filled with an insulator isolating it from an adjacent mesa.

9. The NVRAM device according to claim 5, wherein the NVRAM structure is one of a plurality of NVRAM structures, each structure comprising a mesa, and each mesa having a trench filled with an insulator isolating it from an adjacent mesa.

10. The NVRAM device according to claim 1, wherein the injector element is a field effect transistor.

11. The NVRAM device according to claim 10, further comprising an isolated floating gate embedded in the insulator layer.

12. The NVRAM device according to claim 11, wherein the isolated floating gate comprises a material selected from the group consisting of polysilicon, single crystal silicon, and refractory metal.

13. The NVRAM device according to claim 11, wherein the sensing element further comprises a gate above the SOI layer.

14. The NVRAM device according to claim 13, wherein the NVRAM structure is one of a plurality of NVRAM structures, each structure comprising a mesa, and each mesa having a trench filled with an insulator isolating it from an adjacent mesa.

15. The NVRAM device according to claim 11, wherein the NVRAM structure is one of a plurality of NVRAM structures, each structure comprising a mesa, and each mesa having a trench filled with an insulator isolating it from an adjacent mesa.

16. The NVRAM device according to claim 1, wherein the injector element is a p-type field effect transistor and the sensing element is an n-type field effect transistor.

17. The NVRAM device according to claim 1, wherein the injector element is an n-type field effect transistor and the sensing element is a p-type field effect transistor.

18. The NVRAM device according to claim 1, wherein the injector element comprises complimentary diodes.

19. The NVRAM device according to claim 1, further comprising an isolated floating gate embedded in the insulator layer.

20. The NVRAM device according to claim 19, wherein the isolated floating gate comprises a material selected from the group consisting of polysilicon, single crystal silicon, and refractory metal.

21. The NVRAM device according to claim 19, wherein the sensing element further comprises a gate above the SOI layer.

22. The NVRAM device according to claim 19, wherein the NVRAM structure is one of a plurality of NVRAM structures, each structure comprising a mesa, and each mesa having a trench filled with an insulator isolating it from an adjacent mesa.

23. The NVRAM device according to claim 1, wherein the sensing element further comprises a gate above the SOI layer.

24. The NVRAM device according to claim 23, wherein the gate above the SOI layer comprises polysilicon.

25. The NVRAM device according to claim 1, wherein the NVRAM structure is one of a plurality of NVRAM structures, each structure comprising a mesa, and each mesa having a trench filled with an insulator isolating it from an adjacent mesa.

* * * * *